United States Patent [19]

Milani

[11] Patent Number: 4,744,005

[45] Date of Patent: May 10, 1988

[54] FAN FOR COOLING COMPUTER

[75] Inventor: Dean L. Milani, Highland Park, Ill.

[73] Assignee: Medical Research Laboratories, Inc., Niles, Ill.

[21] Appl. No.: 931,243

[22] Filed: Nov. 14, 1986

[51] Int. Cl.$^4$ ............................................. H05K 7/20
[52] U.S. Cl. ........................................... 361/384; 98/1
[58] Field of Search ........................... 98/1; 174/16 R; 361/384

[56] References Cited

U.S. PATENT DOCUMENTS

| | | | |
|---|---|---|---|
| 4,237,521 | 12/1980 | Denker | 361/384 |
| 4,383,286 | 5/1983 | Hicks | 361/384 |
| 4,643,245 | 2/1987 | Smoot, III et al. | 361/384 X |
| 4,659,349 | 4/1987 | Rodi et al. | 361/384 X |

FOREIGN PATENT DOCUMENTS 57-6296  1/1982  Japan .................................... 361/384

Primary Examiner—Harold Joyce
Attorney, Agent, or Firm—Trexler, Bushnell, Giangiorgi & Blackstone, Ltd.

[57] ABSTRACT

A ventilating device is provided for ventilating an electronic apparatus such as a computer. The device includes a housing having a top wall with a first ventilating aperture therein, and further includes a floor, a pair of side walls extending between said floor and said top wall, and an end wall closing one end of the housing. The housing is open at one end. The device further includes a fan unit secured in the housing adjacent the top wall in substantial alignment with the ventilating aperture and spaced above the housing floor, whereby the fan unit pulls air in through one of the ventilating aperture and open end expels air through the other thereof to facilitate the flow of air through the electronic apparatus.

6 Claims, 3 Drawing Sheets

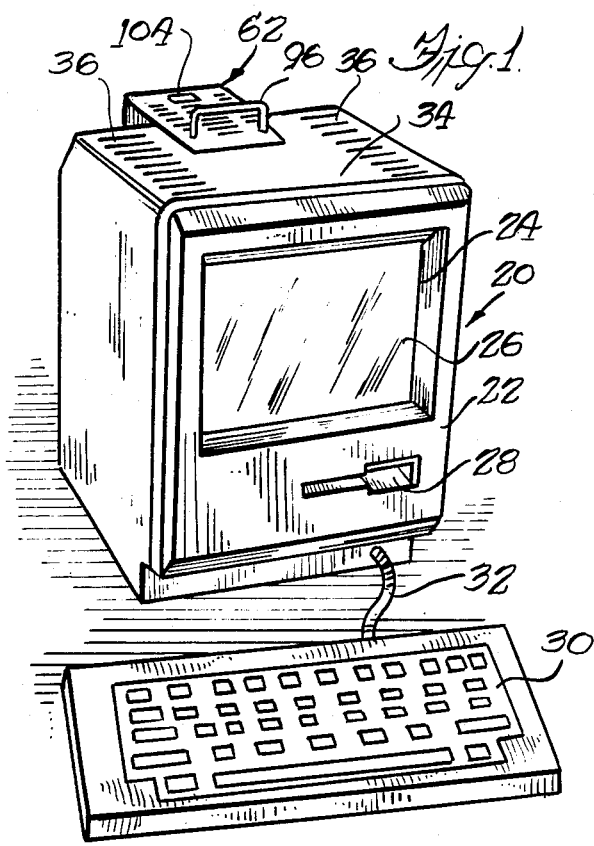
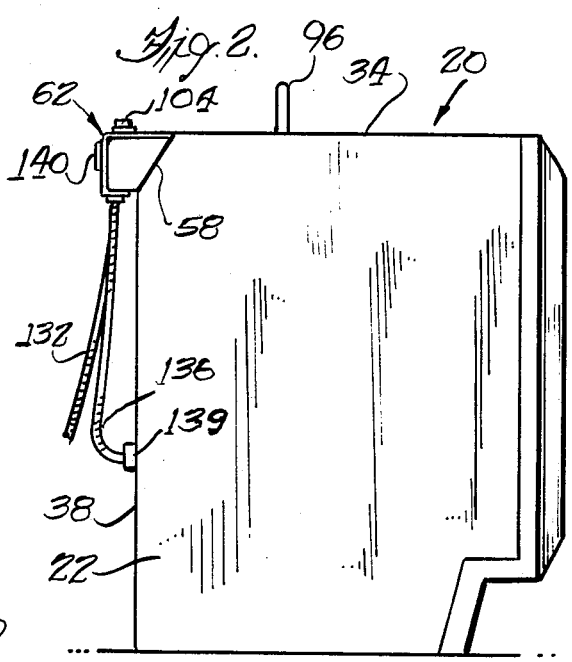
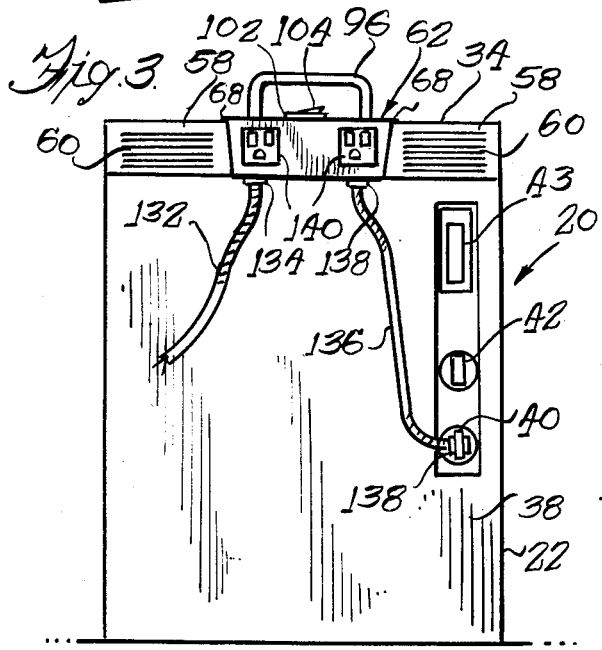
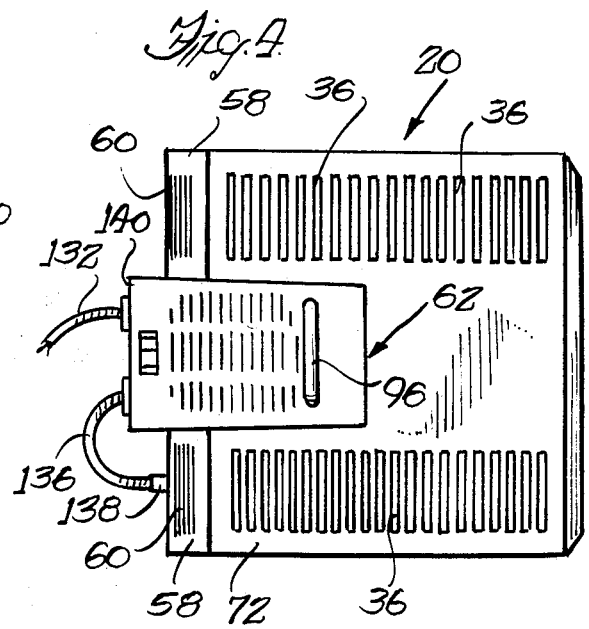
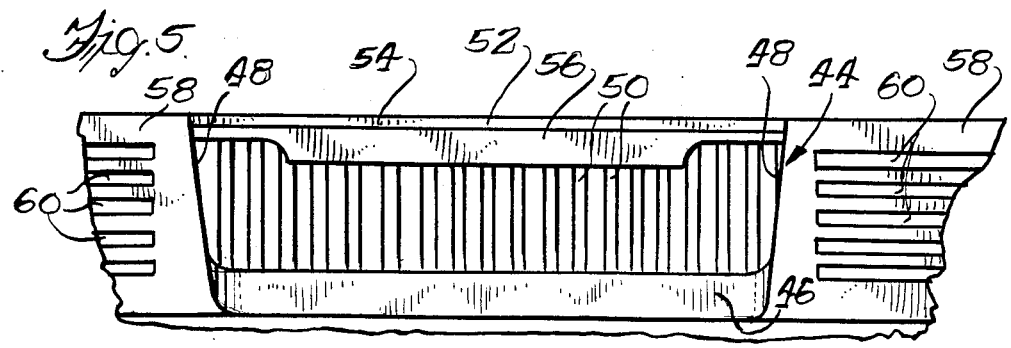

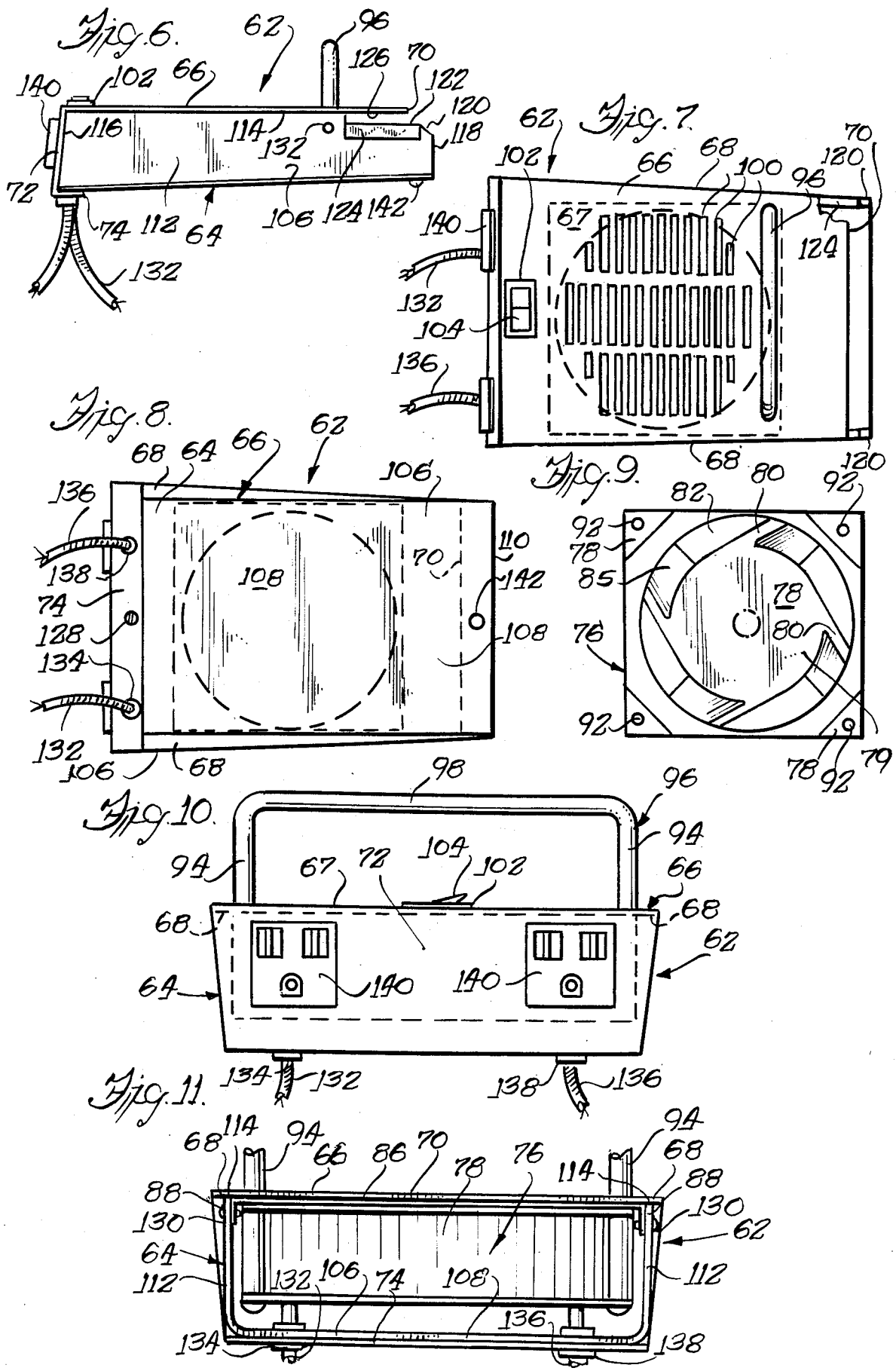

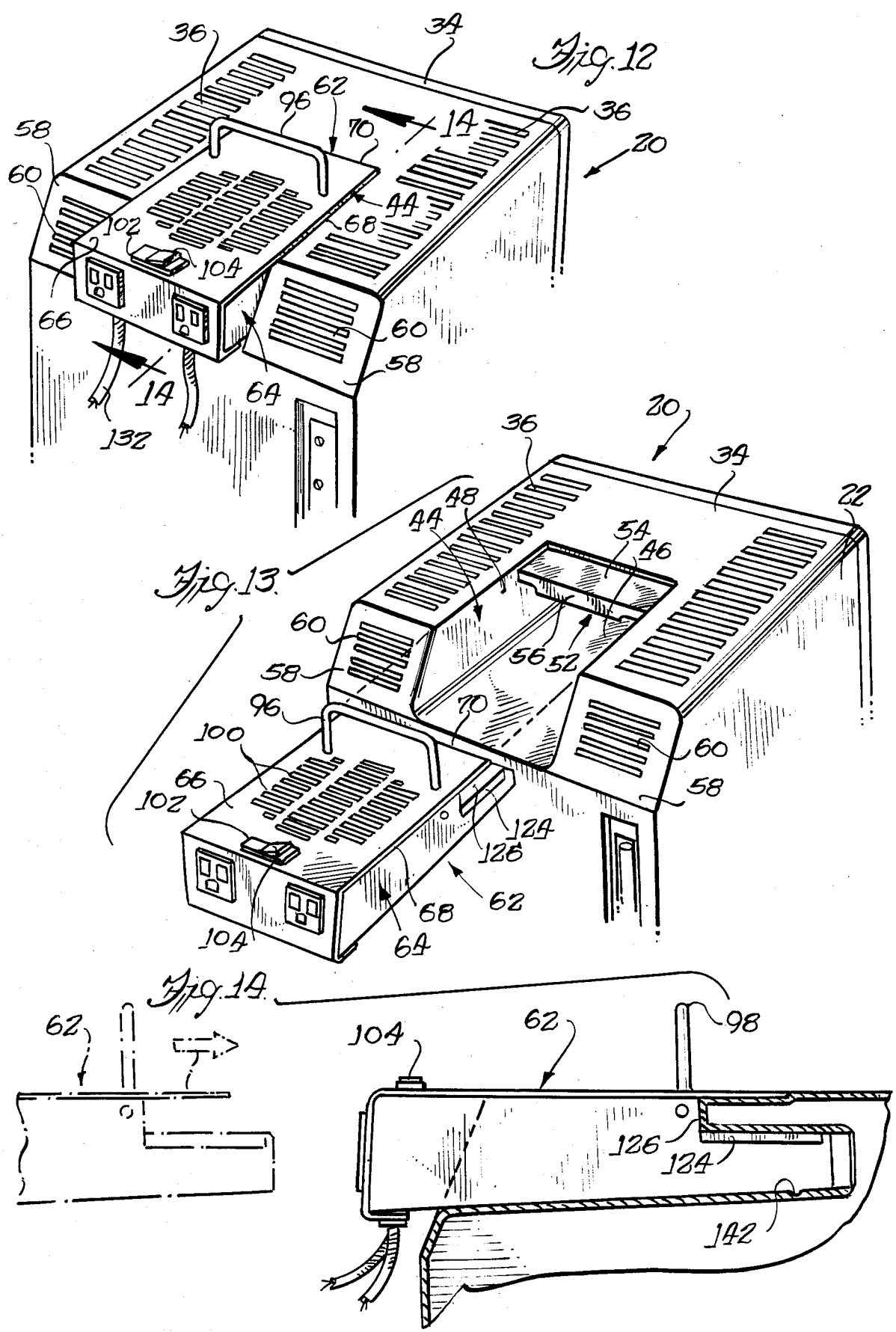

FAN FOR COOLING COMPUTER

BACKGROUND OF THE INVENTION

Some popular computers that are used extensively both in business and in the home rely upon convection cooling. While the electronic components of these computers are all solid state, they still generate some amount of heat. However, considerable additional heat is generated by the power supply and by a motor for a disk drive which is also often included. Actual temperatures of the interior of these computers can reach 170° F. or more. Heat is damaging to integrated circuits and other modern electronic components and leads to shortened service life of components and reduced reliability of the computer or other apparatus utilizing such components.

OBJECTS AND SUMMARY OF THE INVENTION

It is an object of the present invention to provide a device for use with a convection-cooled computer or other electronic device to provide forced-air ventilation and improved cooling of the computer or other apparatus.

More particularly, the present invention provides a device that mounts adjacent an area of a computer or other apparatus which is normally used as an inlet or outlet for convection cooling, and moves air through the interior of the computer or other apparatus.

At least one popular computer model has a molded plastic enclosure that has a handle formed as an integral part of the top of the enclosure. There is an opening beneath the handle for the exit of warm air that rises to the top of the enclosure. Additional air inlet openings are provided elsewhere in the enclosure for enabling a current of air to convectively cool the components of the computer. In accordance with a preferred form of the present invention, a ventilating device is provided which fits into the top of the computer, under its handle.

The ventilating device has a top wall with aperture means therein. It has a bottom wall and a pair of side walls extending between the top and bottom walls. It further has a pair of end walls, with the first end wall closing one end of said housing and the second end wall having aperture means therein. The device further has a fan unit secured in the housing between the top wall aperture means and the end wall aperture means, whereby air is forced through the housing for improving the ventilation of the computer enclosure, when the device is mounted thereto.

It has been found through tests that forcing air through the computer housing with fan of the present invention lowers operating temperatures to the order of 110°-120° F. whereby electronic components and the entire computer last longer and provide greater reliability. It further has been found through tests that blowing into the housing is far more effective in lowering temperatures than is exhausing air from the top of the housing by use of a suction fan, although the invention is not so limited.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings in the several figures of which like reference numerals identify like elements, and in which:

FIG. 1 is a perspective view of a computer showing the device of the present invention assembled therewith;

FIG. 2 is a side elevation on a somewhat enlarged scale of the computer and device of the invention;

FIG. 3 is a rear elevation thereof;

FIG. 4 is a top plan view thereof;

FIG. 5 is an enlarged partial rear elevation of a top portion of the computer housing showing the area into which the device of the invention is inserted;

FIG. 6 is a side elevation of the device of the present invention;

FIG. 7 is a top plan view of the device;

FIG. 8 is a bottom plan view of the device;

FIG. 9 is a top plan view of a fan unit of the device of the present invention;

FIG. 10 is a rear elevation of the device;

FIG. 11 is a front elevation of the device;

FIG. 12 is a top rear partial perspective view of a portion of the computer housing showing the device of the invention inserted for use;

FIG. 13 is a view similar to FIG. 12 but showing the device of the invention prior to insertion; and FIG. 14 is an enlarged partial sectional view taken generally along the line 14—14 in FIG. 12 showing a portion of the device of the invention, prior to insertion, in broken lines.

DETAILED DESCRIPTION OF THE ILLUSTRATED EMBODIMENT

Turning now in greater detail to the figures of the drawings, and first to FIGS. 1-5, there is shown a computer or other electronic apparatus designated generally by the reference numeral 20. By way of specific example, the apparatus may be a Macintosh computer manufactured and sold by Apple Computer, Inc. However, it will be understood that the device of the invention is useful with other apparatus as well, the illustrated computer being by way of example to facilitate description of the invention.

The computer comprises a molded plastic resin housing or enclosure 22 having a front opening 24 framing a display screen 26. The enclosure also is provided at the front with a disc-receiving opening 28 of a disc drive. A keyboard 30 is connected to the enclosure 22 and to the computer components therein (not shown) by means of a flexible cable 32.

The enclosure is provided with a flat top 34 having ventilating slots or apertures 36 therein. The enclosure 22 further has a rear wall 38 having a recessed connector 40 for receiving a mating connector of a power cord. Other externally accessible components include a rocker switch 42 and a backup battery 43 mounted above the outlet 40.

A trough 44 (best viewed in FIG. 13) is molded in the top wall 34 of the enclosure and includes a bottom wall or floor 46, and a pair of side walls 48 tapering slightly in an upward and outward direction from top to bottom of the trough. At an inner end of the trough there is a ventilating aperture 49 covered by a grill comprising vertical bars 50 to preclude entrance of foreign objects into the interior of the computer enclosure. A handle 52 overlies the inner end of the trough and has a flat top surface 54 recessed slightly below the top wall 34 of the enclosure. The handle also has a reinforcing flange 56 depending from a free edge of surface 54. In the normal use of the computer, the fingers of one hand can be inserted into the trough beneath the handle 52 for lifting and carrying the computer.

The open end of the trough 44 is flanked by angled or diagonal wall portions 58 lying on either side of the trough 44. These walls 58 are provided with horizontal through apertures or slots 60. Exit of air from the interior of the computer enclosure is afforded through the slots 60, the opening 49 between the bars 50, and the apertures or slots 36. Air can enter the housing through the opening 28, and perhaps through imperfectly fitted joints, but such convective cooling has often been found to be insufficient.

To correct the problem of insufficient cooling, I have provided a novel ventilating device further details of which are shown in FIGS. 6-11 and which is shown in its operating environment in FIGS. 12-14. Accordingly, reference is invited to these remaining figures of drawing as well. The fan includes a housing 64, preferably of sheet metal, closed on all sides save for one end which is the right end in FIG. 6, which end 64 is open. The housing includes a first member or plate 66 which defines a top wall or surface 67 which is trapezoidal in outline, having side edges 68 that taper slightly inwardly from its rear end to its front end. In this regard directions such as front, rear, top, bottom and sides will be understood to be with reference to the above described computer, and the corresponding directions as to device 62 when it is mounted thereto. The plate 66 has a free front edge 70. The rear end of the plate 66 is bent down to form a rear wall 72, and then is bent forward to provide a flange 74 substantially parallel to the top surface 67 thereof.

The housing 64 is completed by a second, generally channel-shaped member 106, also preferably of sheet metal. This member defines a bottom wall or floor 108 having a front edge 110 parallel to but extending beyond the first member front edge 70. The floor tapers inwardly slightly from its rear to its front. The rear edge of floor 108 overlies the flange 74 and abuts the rear wall 72. The channel-shaped member 106 further defines a pair of side walls 112 which diverge slightly outwardly to either side from the floor 108 to their upper edges 114, and which taper in height from a maximum at the rear end. The upper edges 114 of the side walls engage the underside of the top wall 66 while rear edges 116 thereof engage the rear wall 72. Front edges 118 of the side walls terminate short of the top wall 67, and are provided with diagonally-relieved upper corners 120 leading to horizontal edges 122 spaced from and generally parallel to the top wall 67 to define a recess or slot 126. The edges 122 support rubber abutment members 124 which engage the inner and outer faces of the side walls 112 immediately below each edge 122, and are adhesively secured to these side walls.

The flange 74 is provided with an aperture through which a screw 128 extends and this screw is threaded into an aligned aperture in the bottom wall 108 of the channel-shaped member 106. Two screws 130 respectively extend through the side walls 117 and are threaded into apertures in depending flanges 88 of a bar or strap 86 which will be described later. The three screws 128 and 130 preferably are self-tapping screws to avoid the necessity of pre-tapping the holes into which they are driven. These screws hold the channel-shaped member 106 to the member or plate 66 to form the housing.

A fan unit or blower 76 is best viewed in FIGS. 9 and 11, and comprises a die-cast open-ended frame 78 having a central motor housing 79 joined to the frame by substantially tangential integral arms 80. A flow path 82 extends through the frame, and a rotor 84 is provided having a plurality of radially-extending blades 85 for impelling air through the fan unit. The fan unit is a commercially available unit, and preferably a Model 99XU made by Etri of Monroe, N.C. The blades 85 comprise an integrally molded plastic impeller which is clipped to the rotor and blows air axially through the unit.

The fan unit 76 is a shaded-pole, axial-flow fan rated at 115 volts and drawing only 9 watts at 60 Hz. The fan unit therefore does not generate any appreciable heat. It is preferred that the fan blow air into the enclosure, as it has been established by tests of the above-identified "Macintosh" computer that this produces a much more efficient cooling effect than does exhausting air from the enclosure through the fan. However, the invention is not so limited, as results with other computers or apparatus may vary in this regard.

An elongated bar or strap 86 extends beneath the top wall 67 transversely thereof and has depending flanges 88 at the opposite ends thereof. Screws or bolts 90 extend up through the front two of four mounting holes 92 extending axially through the frame 78 of the fan unit 76. These bolts extend through apertures in the top plate 66 and up into the bottom ends of legs 94 of a U-shaped handle 96 having a bight 98 for gripping to permit handling of the fan, and also of the computer when the device is mounted thereto, as is apparent in the drawings.

Rearwardly of the handle 96, the top wall 67 is provided with an array of transverse slots 100 which align with the fan unit 76 for entrance of air into the fan 62. At the back of the top wall 67 there is provided a switch 102 having a rocker-type actuator 104.

A line cord 132 extends through a fitting 134, mounted through the flange 74 and wall 108 into the interior of the housing. The opposite or free end of the line cord 132 is preferably provided with a three-prong plug (not shown). Another electrical cord 136 extends through a similar fitting 138 through the flange 74 and floor 108 and is provided at the opposite end with a electrical connector 139 selected to interconnect with the line cord connector 40 of the computer. The rear edge of the floor 108 is notched to accommodate the fittings 134 and 38, thereby allowing the channel-shaped member to be assembled with the top plate after the fittings and electrical cords have been assembled with the flange 74.

A pair of three-conductor outlets or sockets 140 is provided on the back wall 72 of the fan housing. The switch 102 is wired to turn on the fan unit 76 and also to provide power to the line 136 as well as to the sockets or outlets 140. The switch 102 thereby serves as a master switch for both the fan and for the computer so that the computer cannot be turned on without also turning on the fan.

The fan housing is tapered as described above so that it generally complements and fits into the tapered trough 44 at the top of the computer housing, the recess or slot 126 in each side wall engaging the corresponding parts of the handle 52, and the rubber overlays or abutment members 124 providing frictional gripping for resisting accidental withdrawal. In addition, the bottom wall 108 adjacent its front edge 110 is provided with a dimple 142 which engages the floor 46 of the trough for further locking the fan in place. It will be apparent from a comparison of FIGS. 12-14 that the fan is inserted into the trough from the rear, with the projecting handle 98 thereafter serving as a handle for the computer as well as for the fan. The handle 98 is relatively near the front of the fan, and hence is relatively near the center of the computer, being positioned adjacent and generally over the handle 52. The rear of the housing 62 projects somewhat rearwardly of the computer as will be seen in FIGS. 4, 12 and 14.

With the ventilating device in place, as shown in FIG. 12, the side edges 68 of the top 67 slightly overlie the top wall of the computer enclosure and the fan unit 76 draws air in through the slots 100 in the top of the housing. The air is forced into the lower part of the housing below the fan unit 76 and above the floor 108 of the channel-shaped member 106. The air then moves to the front and exits from the open front end of the fan housing and through aperature 49 into the interior of the computer housing. Air exits from the computer housing wherever there is an opening, including the slots 36 and 60 at the top, the opening 28 in the front, and any imperfectly sealed joints. It has been found that with an ambient air temperature on the order of 70°-75° F. that the device of the invention will rapidly lower the operating temperature in the interior of the housing from approximately 170° F. to between 110° F. and 120° F. Thus, the components of the computer and the entire computer last longer and provide greater reliability.

While particular embodiments of the invention have been shown and described, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. An accessory ventilating device for use with an electronic apparatus such as a computer having an enclosure including a top wall, a pair of side walls, a front wall and a rear wall, said top wall having an open topped trough therein opening at said rear wall, said trough having a ventilating aperture opening to the interior of said enclosure, and a handle overlying an inner end of said trough, said device comprising: a housing detachably received and fitting in said trough and having an end portion fitting at least in part beneath said electronic apparatus handle portion and a first aperture communicating with said trough ventilating aperture, said housing having a second aperture, and a fan unit in said housing for drawing air in through one of said housing apertures and blowing it out through the other of said housing apertures to facilitate air circulation through the interior of said electronic apparatus enclosure.

2. The device as set forth in claim 1 wherein said housing has a top wall and a floor, one of said apertures being in said top wall, said fan unit being disposed adjacent said top wall in substantial alignment with said aperture and spaced above said floor.

3. The device as set forth in claim 2 wherein said housing additionally has side walls, and wherein the top wall of said housing to either side extends beyond said side walls and overlies in part the top wall of said electronic apparatus enclosure to either side of said trough.

4. The device as set forth in claim 1 wherein both said trough and said housing taper inwardly from maximum dimensions adjacent said electronic apparatus enclosure rear wall toward an inner end of said trough.

5. The device as set forth in claim 1 and further including a handle mounted on said housing and positionable adjacent the electronic apparatus handle and serving as a handle for said electronic apparatus.

6. The combination as set forth in claim 5 wherein said housing has a top wall and one of the apertures thereof is in said top wall, said handle extending upwardly from said top wall, and fastener means extending through said fan unit and said top wall and into said handle for assembling said fan unit and said handle to said top wall.

* * * * *